(12) United States Patent
Gavagnin et al.

(10) Patent No.: US 12,381,138 B2
(45) Date of Patent: Aug. 5, 2025

(54) COMPONENT CARRIER WITH A PHOTOIMAGEABLE DIELECTRIC LAYER AND A STRUCTURED CONDUCTIVE LAYER BEING USED AS A MASK FOR SELECTIVELY EXPOSING THE PHOTOIMAGEABLE DIELECTRIC LAYER WITH ELECTROMAGNETIC RADIATION

(71) Applicant: AT&S Austria Technologie & Systemtechnik Aktiengesellschaft, Leoben (AT)

(72) Inventors: Marco Gavagnin, Leoben (AT); Erich Preiner, St. Michael in Obersteiermark (AT); Hyung Park, Trofaiach (AT)

(73) Assignee: AT&S Austria Technologie &Systemtechnik Aktiengesellschaft, Leoben (AT)

( * ) Notice: Subject to any disclaimer, the term of this patent is extended or adjusted under 35 U.S.C. 154(b) by 586 days.

(21) Appl. No.: 17/652,300

(22) Filed: Feb. 24, 2022

(65) Prior Publication Data

US 2022/0181243 A1    Jun. 9, 2022

Related U.S. Application Data

(63) Continuation of application No. 16/126,878, filed on Sep. 10, 2018, now abandoned.

(51) Int. Cl.
*H01L 23/49* (2006.01)
*G03F 7/095* (2006.01)
(Continued)

(52) U.S. Cl.
CPC ...... *H01L 23/49822* (2013.01); *G03F 7/0955* (2013.01); *G03F 7/11* (2013.01);
(Continued)

(58) Field of Classification Search
CPC ........... H01L 23/49822; H01L 21/4857; H01L 23/49894; G03F 7/0955; G03F 7/11
See application file for complete search history.

(56) References Cited

U.S. PATENT DOCUMENTS

| 5,689,428 A | 11/1997 | Sauerbrey et al. |
| 5,885,745 A | 3/1999 | Marrocco, III |

(Continued)

FOREIGN PATENT DOCUMENTS

| CN | 1292635 A | 4/2001 |
| CN | 101079393 A | 11/2007 |

(Continued)

OTHER PUBLICATIONS

First Office Action in Application No. 201910850889.5; pp. 1-11; Mar. 9, 2022; The China National Intellectual Property Administration; No. 6, Xitucheng Lu, Jimenqiao Haidian District, Beijing City, 100088, China.

(Continued)

*Primary Examiner* — Jeff W Natalini
*Assistant Examiner* — Alexander Belousov
(74) *Attorney, Agent, or Firm* — Robert A. Blaha; Smith Tempel Blaha LLC (57) ABSTRACT

A method for manufacturing a component carrier is disclosed. The method includes the steps of providing a layer stack having at least one component carrier material, forming a photoimageable dielectric layer structure on the layer stack, forming a spatial pattern of an electrically conductive layer structure on the photoimageable dielectric layer structure, wherein the spatial pattern defines openings formed within the electrically conductive layer structure, and exposing the photoimageable dielectric layer structure to electromagnetic radiation, where the spatial pattern of the electrically conductive layer structure represents a mask for (Continued)

selectively exposing predefined regions of the photoimageable dielectric layer structure. Furthermore, the method includes selectively removing material from the photoimageable dielectric layer depending on the spatial pattern.

15 Claims, 4 Drawing Sheets (51) Int. Cl.
    *G03F 7/11*       (2006.01)
    *H01L 21/48*     (2006.01)
    *H01L 23/498*    (2006.01)
    *H05K 3/06*      (2006.01)
    *H05K 3/40*      (2006.01)

(52) U.S. Cl.
    CPC .... *H01L 21/4857* (2013.01); *H01L 23/49894* (2013.01); *H05K 3/064* (2013.01); *H05K 3/4038* (2013.01)

(56) References Cited

U.S. PATENT DOCUMENTS

| | | | |
|---|---|---|---|
| 6,027,858 | A | 2/2000 | Jones et al. |
| 6,349,456 | B1 * | 2/2002 | Dunn .................... H05K 1/162 29/25.42 |
| 6,521,844 | B1 | 2/2003 | Fuerniss et al. |
| 9,236,338 | B2 | 1/2016 | Nakatani et al. |
| 9,406,531 | B1 | 8/2016 | Camacho et al. |
| 9,439,291 | B2 | 9/2016 | Kubota |
| 9,485,874 | B2 | 11/2016 | Chen et al. |
| 2004/0137659 | A1 | 7/2004 | Ding et al. |
| 2007/0269738 | A1 | 11/2007 | Itagaki et al. |
| 2009/0166612 | A1 | 7/2009 | Cain et al. |
| 2014/0124777 | A1 | 5/2014 | Nakatani et al. |
| 2015/0227042 | A1 | 8/2015 | Kubota |
| 2015/0382473 | A1 | 12/2015 | Okamoto et al. |
| 2017/0018501 | A1 | 1/2017 | Maple et al. |
| 2017/0042026 | A1 | 2/2017 | Wu et al. |
| 2017/0079142 | A1 | 3/2017 | Lee et al. |
| 2017/0287782 | A1 | 10/2017 | Dang et al. |
| 2019/0067394 | A1 | 2/2019 | Cheon et al. |
| 2019/0097118 | A1 | 3/2019 | Rouse et al. |
| 2020/0043750 | A1 | 2/2020 | Uehling et al. |

FOREIGN PATENT DOCUMENTS

| | | |
|---|---|---|
| CN | 202587576 U | 12/2012 |
| CN | 103094287 A | 5/2013 |
| CN | 103189970 A | 7/2013 |
| JP | H03050887 A | 3/1991 |
| JP | H06275950 A | 9/1994 |
| JP | H08018239 A | 1/1996 |
| JP | H1098266 A | 4/1998 |
| JP | H10209644 A | 8/1998 |
| JP | H11212272 A | 8/1999 |
| JP | 2000133935 A | 5/2000 |
| JP | 2004341478 A | 12/2004 |
| JP | 2005037754 A | 2/2005 |
| JP | 2005037755 A | 2/2005 |
| JP | 2014203005 A | 10/2014 |
| JP | 2014235391 A | 12/2014 |
| JP | 2015018029 A | 1/2015 |
| JP | 2016034010 A | 3/2016 |
| JP | 2016188921 A | 11/2016 |
| JP | 2016213299 A | 12/2016 |
| JP | 2017005193 A | 1/2017 |
| KR | 1020040061258 A | 11/2004 |
| TW | 201513753 A | 4/2015 |
| WO | 2014171525 A1 | 10/2014 |
| WO | 2015064280 A1 | 5/2015 |
| WO | 2015175197 A1 | 11/2015 |
| WO | 2015177947 A1 | 11/2015 |
| WO | 2016060191 A1 | 4/2016 |
| WO | 2016060237 A1 | 4/2016 |
| WO | 2016158362 A1 | 10/2016 |
| WO | 2017007001 A1 | 1/2017 |
| WO | 2017018299 A1 | 2/2017 |
| WO | 2017019866 A1 | 2/2017 |

OTHER PUBLICATIONS

English translation of Cover Pages of First Office Action in Application No. 201910850889.5; pp. 1-3; Mar. 9, 2022; The China National Intellectual Property Administration; No. 6, Xitucheng Lu, Jimenqiao Haidian District, Beijing City, 100088, China.

Derbal, J.; Communication Under Rule 71(3) EPC in Application No. 19 193 661.6-1211; pp. 1-5 of 44; May 7, 2021; European Patent Office; Postbus 5818; 2820 HV Rijswijk, Netherlands.

McDermott, B.J.: "Photodefined vias enable high density designs", Electronic Packaging and Production, Cahners Publishing Co., Newton, Massachusetts, US, vol. 36, No. 5, May 1, 1996, p. 45/46/48.

Extended European Search Report, EP Application No. 19193661.6; pp. 1-11; Feb. 18, 2020; European Patent Office, 80298, Munich, Germany.

* cited by examiner

COMPONENT CARRIER WITH A PHOTOIMAGEABLE DIELECTRIC LAYER AND A STRUCTURED CONDUCTIVE LAYER BEING USED AS A MASK FOR SELECTIVELY EXPOSING THE PHOTOIMAGEABLE DIELECTRIC LAYER WITH ELECTROMAGNETIC RADIATION

TECHNICAL FIELD

Embodiments of the invention relate to the technical field of component carriers which are used as support structures for building up electronic assemblies (i.e., electronic circuits comprising one or more electronic components).

BACKGROUND

A component carrier such as a Printed Circuit Board (PCB) is a support structure for at least one electronic component forming an electronic assembly or an electronic circuit. Conductor traces representing an interconnecting wiring are formed from a thin metal layer comprising in particular copper. The conductor traces are formed by an appropriate structuring or patterning of an electrically conductive layer which is provided on top or beneath an electrically insulating layer of a component carrier. An electronic component may be mounted on an upper or lower surface of a component carrier. In some applications, an electronic component is embedded at least partially within (the volume of) a component carrier.

A multilayer component carrier is a laminated stack consisting of several electrically conductive layer structures and several electrically insulating or dielectric layers in an alternating sequence. Metallized vias extending through at least one insulating layer may be used for electrically connecting different electrically conductive layer structures.

Electrically insulating or dielectric layer structures may be made e.g. from a resin which can be mechanically supported by a glass fiber mesh. However, also photosensitive or photoimageable resin can be employed for forming a dielectric layer structure of a component carrier. A photoimageable resin can be spatially structured first by exposing the photoimageable resin to spatially structured electromagnetic radiation and second by selectively etching away material from the photoimageable resin. For spatially structuring electromagnetic radiation impinging onto a photoimageable resin, a special mask has to be used as described for instance in US 2014/0124777 A1. With such a combination of photo-imaging and chemical etching, vias can also be formed within photoimageable resin.

SUMMARY

There may be a need for a component carrier comprising a structured photoimageable dielectric layer which can be manufactured in an easy and effective manner.

This need may be met by the subject matter according to the independent claims. Advantageous embodiments of the present invention are described by the dependent claims.

According to a first embodiment there is provided a component carrier which comprises (a) a layer stack having at least one component carrier material; and (b) a photoimageable dielectric layer structure formed on top of the layer stack. The photoimageable dielectric layer structure has at least one recess extending vertically through the photoimageable dielectric layer structure. The at least one recess is or has been formed by partially removing the photoimageable dielectric layer structure in regions which are defined by a spatial pattern of an electrically conductive layer structure being (directly) formed on the photoimageable dielectric layer structure. The spatial pattern comprises openings formed within the electrically conductive layer structure.

The described component carrier is based on the idea that a photoimageable dielectric (PID) layer structure can be structured and respectively patterned by exploiting the spatial design of a structured and respectively patterned electrically conductive layer structure as a mask for the material of the PID layer (structure). Thereby, the at least one opening within the electrically conductive layer structure makes accessible the PID layer for a photo-imaging treatment e.g. by means of ultraviolet (UV) radiation. Since photo-imaging treatment procedures are well known to the skilled person, no further details about the basic principles of photo-imaging are given in this document.

The described electrically conductive layer structure may not only be used as a mask for photo-imaging but at the same time may serve as a base layer for (a build-up of) further or additional electrically conductive layer structure(s) and/or dielectric layer structure(s), which may form a part of the described component carrier. Such an additional built-up or layered arrangement may comprise e.g. a redistribution layer (RDL), which may make narrowly spaced electric contacts of an integrated electronic component available in other locations which are more widely spaced apart from each other.

The layer stack may comprise different layers being formed one over the other. The different layers may comprise different materials. However, at least one material of at least one layer of the layer stack comprises a component carrier material or printed circuit board material as elucidated below. The layer stack and, as a consequence also the entire component carrier, may comprise a stack of at least one electrically insulating layer and at least one electrically conductive layer. For example, the layer stack of the respective component carrier may be a laminate of the mentioned electrically insulating layer(s) and electrically conductive layer(s), in particular formed by applying mechanical pressure and/or thermal energy. The component carrier, optionally being provided with additional layers (or structures) may provide a plate-shaped mounting base capable of providing a large mounting surface for additional components while nevertheless being very thin and compact. The terms "layer" and/or "layer structure" may particularly denote a continuous layer, a patterned layer or a plurality of non-consecutive islands within a common plane.

OVERVIEW OF EMBODIMENTS

In the context of this document the term "component carrier" may particularly denote any support structure which is capable of accommodating one or more (electronic) components thereon and/or therein for providing mechanical support and/or electrical connectivity. In other words, a component carrier may be configured as a mechanical and/or electric carrier for electronic components. In particular, a component carrier may be one of a printed circuit board, an (organic) interposer, and an integrated circuit (IC) substrate. A component carrier may also be a hybrid board combining different ones of the above mentioned types of component carriers.

The term "photoimageable" may particularly mean that upon an exposure of electromagnetic waves having an appropriate wavelength, e.g. UV light, the internal chemical and/or physical structure changes which causes a lithography process like developing for a via or a pattern formation. For some photoimageable dielectric (PID) materials, an exposure of light has the effect that the respective exposed portions become "unstable" and can be removed at least partially with an appropriate etching treatment. Such a type of PID material is often called a positive PID material. Other PID materials become stable when being irradiated with or exposed to appropriate electromagnetic waves. This means, that upon an etching treatment only the irradiated portions of the PID material will remain stable and all other portions will be removed at least partially. This other type of PID material is often denominated as a negative PID material.

Using the spatial pattern of the electrically conductive layer structure as a mask for structuring the PID layer may provide the advantage that in contrast to known structuring procedures such as e.g. laser ablation or mechanical cutting, the efficiency of the recess formation process can be significantly increased. Specifically, a parallelization of an etching formation of recesses can be realized such that in particular when a large number of recesses have to be formed, a corresponding throughput may be significantly, e.g. by a factor of 2 to 13, larger as compared to a throughput which can be realized with known PID structuring procedures. This parallelization of course also reduces the process costs.

According to an embodiment, the component carrier comprises the electrically conductive layer structure formed on the photoimageable dielectric layer structure.

As has been mentioned above, in this embodiment, the electrically conductive layer structure (having been previously used as a mask) forms a part of the (final) component carrier. Further, this embodiment can be realized in particular when using a positive PID material for the photoimageable dielectric layer structure. This embodiment can be described as follows: a component carrier comprising (a) a layer stack comprising at least one component carrier material; (b) a photoimageable dielectric layer structure formed on the layer stack; and (c) an electrically conductive layer structure formed on the photoimageable dielectric layer structure, the electrically conductive layer structure having at least one opening; wherein the photoimageable dielectric layer structure has at least one recess being located under and spatially aligned with the opening of the electrically conductive layer structure.

In this context, the term "aligned" may particularly mean that with respect to an x-direction and a y-direction there is no offset between the opening formed in the electrically conductive layer structure and the respective recess formed in the PID layer structure. Thereby, the x-direction and the y-direction define a plane being parallel to the spatial extension of the various layers of the described component carrier. In other words, both the x-direction and the y-direction are perpendicular to a z-direction along which a thickness of the layer structures of the component carrier is measured.

According to a further embodiment, the electrically conductive layer structure having the openings formed therein comprises at least one layer of the group of materials consisting of copper, aluminum, nickel, silver, titanium and gold. This may provide the advantage that for realizing the mask being used for exposing the PID layer, a common material being widely accepted for PCB manufacturing can be relied upon. This may facilitate the control of manufacturing the described component carrier.

According to a further embodiment, the component carrier further comprises an electrically conductive material provided within the at least one recess and/or formed on the electrically conductive layer structure.

Depending on the specific application the at least one recess formed within the PID layer structure may be filled completely or may be filled only partially with the electrically conductive material. Alternatively or in combination, the electrically conductive layer structure may be covered with a certain thickness of the electrically conductive material.

The electrically conductive material may be the same material as the material being used for the electrically conductive layer structure. This means that outside from the at least one recess the material of the electrically conductive layer structure and the described electrically conductive material may add up to a common amount of (single piece) material. This same material may be in particular copper.

It is pointed out that before forming the described electrically conductive material a seed layer can be formed. Such a seed layer may comprise only a few atomic layers of the material being used in particular for the described electrically conductive material. A seed layer may be formed e.g. by means of an electroless plating procedure.

According to a further embodiment, the electrically conductive material provided within the at least one recess forms a via connection extending through the photoimageable dielectric layer structure. Alternatively or in combination, the electrically conductive material provided within the at least one recess forms a pattern within a plane being perpendicular to the vertical extension of the recess.

Due to the described spatially selective imaging of the PID layer structure the at least one recess can be realized by an appropriate etching procedure. This means that a via formation can be accomplished without a drilling procedure such as e.g. a mechanical drilling and/or a laser drilling. A particular advantage of etching the photo imaged PID layer structure can be seen that a large number of vias can be formed simultaneously with an appropriate etching procedure. Thereby, it is not necessary that all vias have the same size because a corresponding etching substance acts in a spatial selective manner on the PID material, wherein the location of the material being removed from the PID layer structure depends on the spatial design of the mask. In other words, also differently sized vias can be formed within one common (etching) process step.

Compared in particular with laser drilling, the described use of a location or position dependent etching may yield vias having a desired geometry. Specifically, the etched vias may have an at least approximately perfect cylindrical shape with side walls which are much steeper as compared to truncated cone sidewalls which are typically produced with laser drilling.

According to a further embodiment, the electrically conductive material provided within the at least one recess forms a pattern within a plane being perpendicular to the vertical extension of the recess. This means that this pattern extends within a so called xy-plane which is parallel to a main plane of the layers of the described component carrier. This may allow to add further electric circuitry to the component carrier.

According to a further embodiment, the recess forms a cavity within the photoimageable dielectric layer structure. The cavity may be used for accommodating additional components or structures. The cavity may extend completely through the PID layer structure. Alternatively, the cavity may only have a depth which is smaller than the thickness of the PID layer structure. Further, a plurality of recesses or cavities may have the same lateral size and/or depth. Alternatively, different recesses or cavities may have different spatial dimensions.

According to a further embodiment, the component carrier further comprises at least one component being accommodated within the at least one recess. The size of the at least one recess may be adapted to the size of the component. Specifically, in case of a comparatively thick PID layer structure and/or a comparatively thin component, the recess may extend only partially through the PID layer structure.

For accommodating component(s) by embedding the respective component, the size of the corresponding recess may be selected such that there is a gap between the side surface of a component and a corresponding inner sidewall of the recess. In some embodiments, this gap is filled with resin. In other embodiments, the size of the recess is the same or is only slightly larger than the size of the component such that the component, after having been inserted into the recess, is accommodated in a spatially defined manner.

The above mentioned "drill less" etching procedure for vias may be of particular advantage when the described component is located in close proximity to a via which is supposed to be formed. Specifically, with the described etching procedure vias can be formed in close proximity to or over the accommodated component without the risk of damaging the component and/or damaging a redistribution layer (RDL) formed (directly) on or over the accommodated component. This may be an essential advantage compared to a formation of vias by laser drilling.

According to a further embodiment, the accommodated component is selected from a group consisting of an electronic component, an electrically non-conductive and/or electrically conductive inlay (such as a metal inlay, preferably comprising copper or aluminum), a heat transfer unit (for example a heat pipe), an energy harvesting unit, an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, an actuator, a microelectromechanical system (MEMS), a microprocessor, a capacitor, a resistor, an inductance, an accumulator, a switch, a camera, an antenna, a magnetic element, a further component carrier and a logic chip.

However, also other component types may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite core) or may be a paramagnetic element. However, the component may also be a substrate, an interposer or a further component carrier such that a so called board-in-board configuration is realized. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as components.

According to a further embodiment, the component carrier further comprises an additional photoimageable dielectric layer structure formed at the bottom of the layer stack, wherein the additional photoimageable dielectric layer structure has at least one corresponding recess extending vertically through the additional photoimageable dielectric layer structure. The at least one corresponding recess is formed by partially removing the additional photoimageable dielectric layer structure in regions which are defined by a respective spatial pattern of a corresponding electrically conductive layer structure being (directly) formed at the bottom of the additional photoimageable dielectric layer structure. The respective spatial pattern comprises respective openings formed within the corresponding electrically conductive layer structure.

Descriptively speaking, the described component carrier comprises a sandwich type arrangement wherein the layer stack is located between the two PID layer structures, i.e. the PID layer structure and the further PID layer structure. Thereby, in a cross-sectional view, this arrangement may be symmetric with respect to a middle plane of the layer stack. Such a symmetric design may provide the advantage that mechanical stress which may occur during manufacturing the described component carrier may be the same at both sides (i.e. above and below) of this middle plane. In some embodiments, at least fractions of such a stress may be compensated with a corresponding stress occurring at the other side the middle plane.

According to a further embodiment, the layer stack comprises at least a part of a wafer, in particular a singularized semiconductor piece of a wafer.

The part of the wafer may be at least one semiconductor chip which has been generated from the wafer by means of an appropriate separation or singularization procedure. Further, the wafer may be an artificial wafer, wherein the semiconductor chips of the original monolithic wafer have been singularized and placed on a carrier such as a sticky carrier foil in order to allow simultaneous processing of a plurality of semiconductor chips. Also a casting compound can be used for forming or realizing such an artificial wafer.

Bare or naked semiconductor chips (e.g., semiconductor wafers without a housing) can be easily processed and in a reliable manner when being integrated within or when forming part of the described layer stack. Specifically, by using the described PID layer structure and/or the electrically conductive layer structure, which has previously been used as the mask, further built-up structures can be generated for each semiconductor chip. Such a build-up structure may be e.g. a RDL arrangement. Of course, a build-up may also serve as a housing for protecting a respective semiconductor chip.

According to a further embodiment, the layer stack comprises (a) at least a part of a further wafer and (b) a carrier structure formed between (a part of) the wafer and (a part of) the further wafer.

In this embodiment, the layer stack forms again a sandwich like arrangement, wherein the described carrier structure is located between (a part of) the wafer and (a part of) the further wafer. A further processing of the component carrier with two wafers may allow for a high efficiency and high throughput semiconductor component processing, which may produce housed or protected semiconductor chips. Thereby, highly efficient and reliable semiconductor processes or processing can be realized when a component carrier has at least two PID layer structures on both sides of the layer stack.

In particular, when the "double wafer layer stack" is realized in a symmetric manner, additional processing of semiconductor chip(s) of the wafer and the further semiconductor chip(s) of the further wafer can be carried out in a precise and reliable manner. In addition, mechanical stresses, e.g. caused by materials having different coefficients of thermal expansion (CTE), which mechanical stresses occur both above and below the carrier structure, may at least partially compensate each other.

According to a further embodiment, the component carrier is configured as a laminate-type component carrier. This may provide the advantage that the component carrier can be manufactured in a simple and an easy manner.

According to a further embodiment, the component carrier material comprises at least one of the group consisting of resin such as reinforced or non-reinforced resins, for instance epoxy resin or Bismaleimide-Triazine resin, cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based Build-Up Film, polytetrafluoroethylene) (Teflon®), a ceramic, and a metal oxide. Teflon is a registered trademark of the E.I. Du Pont De Nemours and Company of Delaware, U.S.A. Reinforcing materials such as webs, fibers or spheres, for example made of glass (multilayer glass) may be used as well. Although prepreg such as FR4 are usually preferred for rigid PCBs, other materials (in particular epoxy-based Build-Up Film for substrates) may be used as well. For high frequency applications, high-frequency materials such as polytetrafluoroethylene, liquid crystal polymer and/or cyanate ester resins, low-temperature cofired ceramics (LTCC) or other low, very low or ultra-low DK-materials may be implemented in the component carrier as electrically insulating layer structure.

According to a further embodiment, the component carrier is configured as one of the group consisting of a printed circuit board and a substrate.

In the context, the term "printed circuit board" (PCB) may particularly denote a component carrier which is formed by laminating several electrically conductive layer structures with at least one electrically insulating layer structure, for instance by applying pressure and/or thermal energy. A PCB may be plate-shaped (i.e. planar), three-dimensionally curved (for instance when manufactured using 3D printing) or may have any other shape. As preferred materials for PCB technology, the electrically conductive layer structures are made of copper, whereas the electrically insulating layer structures may comprise resin and/or glass fibers, FR4 material (i.e., a prepreg). The various electrically conductive layer structures may be connected to one another in a desired way by forming through-holes through the laminate, for instance by laser drilling, mechanical drilling or etching, and by filling them at least partially with electrically conductive material such as, in particular, copper, thereby forming vias as through-hole connections. Apart from one or more components which may be embedded, a PCB is usually configured for accommodating one or more components on one or both opposing surfaces of the plate-shaped printed circuit board. Such components may be connected to the respective main surface by soldering. A dielectric part of a PCB may be composed of resin with reinforcing fibers such as e.g. glass fibers.

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example metallized holes or vias. These lateral and/or vertical connections are arranged within the substrate and can be used to provide electrical and/or mechanical connections of housed components or unhoused components (such as bare dies), particularly of IC chips, with a PCB or an intermediate PCB. Thus, the term "substrate" also includes "IC substrates." A dielectric part of a substrate may be composed of resin with reinforcing spheres (such as glass spheres).

According to a further embodiment, the layer stack comprises an electrically conductive material from the group consisting of copper, aluminum, nickel, silver, gold, palladium, and tungsten, any of the mentioned materials being optionally coated with supra-conductive material such as graphene. Although copper is usually preferred, other materials or coated versions thereof are possible as well, in particular materials coated with graphene.

According to a further aspect there is provided a method for manufacturing a component carrier. The provided manufacturing method comprises (a) providing a layer stack having at least one component carrier material; (b) forming a photoimageable dielectric layer structure on the layer stack; (c) forming a spatial pattern of an electrically conductive layer structure on the photoimageable dielectric layer structure, wherein the spatial pattern comprises openings formed within the electrically conductive layer structure; (d) exposing the photoimageable dielectric layer structure to electromagnetic radiation, wherein the spatial pattern of the electrically conductive layer structure represents a mask for selectively exposing predefined regions of the photoimageable dielectric layer structure; and (e) selectively removing material from the photoimageable dielectric layer depending on the spatial pattern.

Also the described method is based on the idea that at least one recess within a photoimageable dielectric (PID) layer structure can be formed by using a mask which is realized by a spatial pattern of an electrically conductive layer structure. In some embodiments the described electrically conductive layer structure is a temporary structure which, after completing the recess formation, is removed from the component carrier. However, in preferred embodiments the electrically conductive layer structure is also used as a base layer for (a build-up of) further or additional electrically conductive layer structure(s) and/or dielectric layer structure(s) which may form a part of the described component carrier. The PID material could be a thermal curable or photo curable resin, or combination of both.

According to a further embodiment the layer stack, the photoimageable dielectric layer structure, and the electrically conductive layer structure are assembled together by a lamination procedure.

Using a lamination procedure for mechanically connecting the respective layer structures may provide the advantage that all layer structures being necessary for the component carrier to be manufactured can be put together with a simple and efficient procedure. Thereby, the lamination procedure may be realized in such a manner that a stable layer attachment is possible even without using adhesive layers. Specifically, a lamination procedure may allow for a stable attachment (i) of the PID layer structure directly at the layer stack and (ii) of the electrically conductive layer structure directly at the PID layer structure.

With regard to the lamination procedure described here the same considerations apply as for the above described lamination of the layer stack. This means that the lamination procedure may include applying a pressure and/or thermal energy.

According to a further embodiment, the method further comprises forming an electrically conductive material within the at least one recess and/or on the electrically conductive layer structure.

The electrically conductive material may be deposited at the desired locations by any deposition procedure which may be used for a deposition of metallic materials. Preferably, the electrically conductive material may be formed by a galvanic deposition and in particular by a galvanic deposition of copper.

It has to be noted that embodiments of the invention have been described with reference to different subject matters. In particular, some embodiments have been described with reference to apparatus claims whereas other embodiments have been described with reference to method type claims. However, a person skilled in the art will gather from the above and the following description that, unless otherwise noted, in addition to any combination of features belonging to one type of subject matter also any combination between features relating to different subject matters, in particular between features of the apparatus type claims and features of the method type claims is considered as to be disclosed with this document.

The aspects defined above and further aspects of the present invention are apparent from the examples of embodiment to be described hereinafter and are explained with reference to the examples of embodiment. The invention will be described in more detail hereinafter with reference to examples of embodiment but to which the invention is not limited.

BRIEF DESCRIPTION OF THE DRAWINGS

Embodiments of the component carrier can be better understood with reference to the following drawings. The elements and features in the drawings are not necessarily to scale, emphasis instead being placed upon clearly illustrating the structures and principles of operation of the assemblies.

DETAILED DESCRIPTION OF ILLUSTRATED EMBODIMENTS

The illustrations in the drawings are schematically presented. It is noted that in different figures, similar or identical elements or features are provided with the same reference signs or with reference signs, which are different from the corresponding reference signs only within the first digit. In order to avoid unnecessary repetition, elements or features, which have already been elucidated with respect to a previously described embodiment, are not elucidated again at a later position of the description.

Further, spatially relative terms, such as "front" and "back", "above" and "below", "left" and "right", et cetera are used to describe an element's relationship to other element(s) or features as illustrated in the Figures. Thus, the spatially relative terms may apply to orientations in use which differ from the orientation depicted in the Figures. Obviously all such spatially relative terms refer to the orientation shown in the Figures only for ease of description and are not necessarily limiting as an apparatus according to an embodiment of the invention can assume orientations different than those illustrated in the Figures when in use.

Figure 1A:
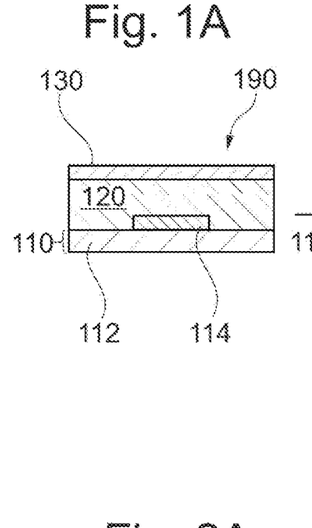
FIGS. 1A, 1B, 1C illustrate a recess/via formation within a photoimageable dielectric (PID) layer structure by using a patterned electrically conductive layer structure as a mask for spatially selectively irradiating the PID layer with electromagnetic radiation.
Figure 1B:
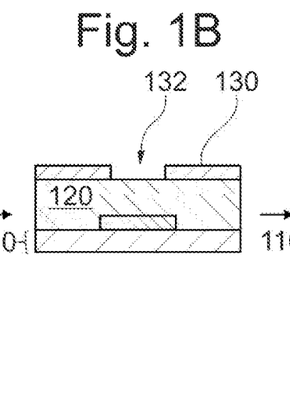
Figure 1C:
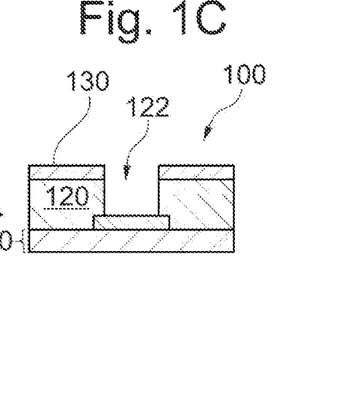

FIGS. 1A, 1B and 1C illustrate the main steps of a process for forming a recess or a via in a photoimageable dielectric (PID) layer structure of a component carrier in accordance with an embodiment of the invention. FIG. 1A shows a laminated layer stack 190 which represents the starting point for manufacturing the component carrier. The laminated stack 190 comprises a laminated PCB layer stack 110, which itself comprises at least one layer sequence consisting of a dielectric resin layer and metal layer structure. In FIG. 1A, the PCB layer stack 110 is depicted as a single layer PCB having only one dielectric resin layer 112 and one structured metal layer 114. However, in many embodiments, the laminated PCB layer stack 110 comprises two, three, or even more of such layer sequences.

On top of the laminated PCB layer stack 110 there is formed a photoimageable dielectric (PID) layer 120. The PID layer 120 may have a thickness of e.g. 10 μm to 100 μm. On top of the PID layer 120 there is formed a so far unstructured electrically conductive layer 130. The electrically conductive layer 130, which according to the embodiment described here is made from copper, may have a thickness of e.g. 0.1 μm to 50 μm.

It is pointed out that in the illustrated embodiment the layer stack 110 could be a conventional PCB with conductive tracks formed on a dielectric layer. However, alternatively an embedded conductive track stack up could be used, in which the conductive track is at the same height or slightly below the dielectric surface. This alternative arrangement could be chosen also for all other embodiments described here with reference to the other Figures which are elucidated below.

As shown in FIG. 1B, a first lithographic process forms a window in the electrically conductive layer 130. The window, which in this document is called an opening, is denominated with reference numeral 132.

In a next step the upper side of the structure shown in FIG. 1B is irradiated with electromagnetic radiation. Thereby, the now structured electrically conductive layer 130 acts as a mask for selectively exposing the PID layer 120 within the region aligned with the opening 132. The exposure of the electrically conductive layer 130 to electromagnetic radiation sensitizes the PID layer 120 in registration with the opening 132 to a chemical etching process.

The result of a corresponding etching process is shown in FIG. 1C. The respective material of the PID layer 120 has been removed such that a recess 122 is formed within the now structured PID layer 120. The two steps of photo imaging the PID layer 120 through the opening 132 and the following (chemical) etching of the PID layer 120 selectively within the region of the opening 132 can be seen as a second lithographic process.

Although the arrangement shown in FIG. 1C may be an intermediate product for further manufacturing electronic devices, in this document this arrangement is denominated a component carrier 100. For instance, the structured electrically conductive layer 130, which has been used as a mask, can be used for building up further electrically insulating and/or electrically conductive structures (not shown) of a larger electronic device. An example for such a build-up is a so called fan-out redistribution layer (RDL) arrangement.

Descriptively speaking, the process for manufacturing the component carrier 100 can be seen as a two-stage lithographic process wherein first within the electrically conductive layer 130 the windows being necessary for forming the recesses such as vias or cavities are realized. In a second lithographic process the PID layer 120 is structured such that the recesses 122 are formed. In the second lithography process the electrically conductive layer structure 130 serves as a mask for the PID layer 120 below. Hence, no (dedicated) masks are needed for appropriately structuring the PID layer 120. The roughness of the electrically conductive layer structure 130 will provide the necessary adhesion of the electrically conductive layer structure 130 to the PID layer 120 formed below. In addition, also chemical adhesion layers could be provided between the conductive layer structure and the PID, in particular for applications requiring high reliability in terms of peeling strength performance.

The benefit of the described PID structuring is the possibility to obtain "z-direction structures", i.e. structures extending into a direction being perpendicular to the main planes of the layers, with different geometries by means of one exposure step. Therefore, vias with different diameters can be effectively achieved on one and the same the same PID layer 120. Further, also trenches or cavities with appropriate spatial dimensions can be realized.

FIGS. 2A through 2E illustrate a process overview for respectively forming recesses or vias within two PID layers provided at different sides of a PCB layer stack.

Figures 2A, 2B, 2C, 2D, 2E:
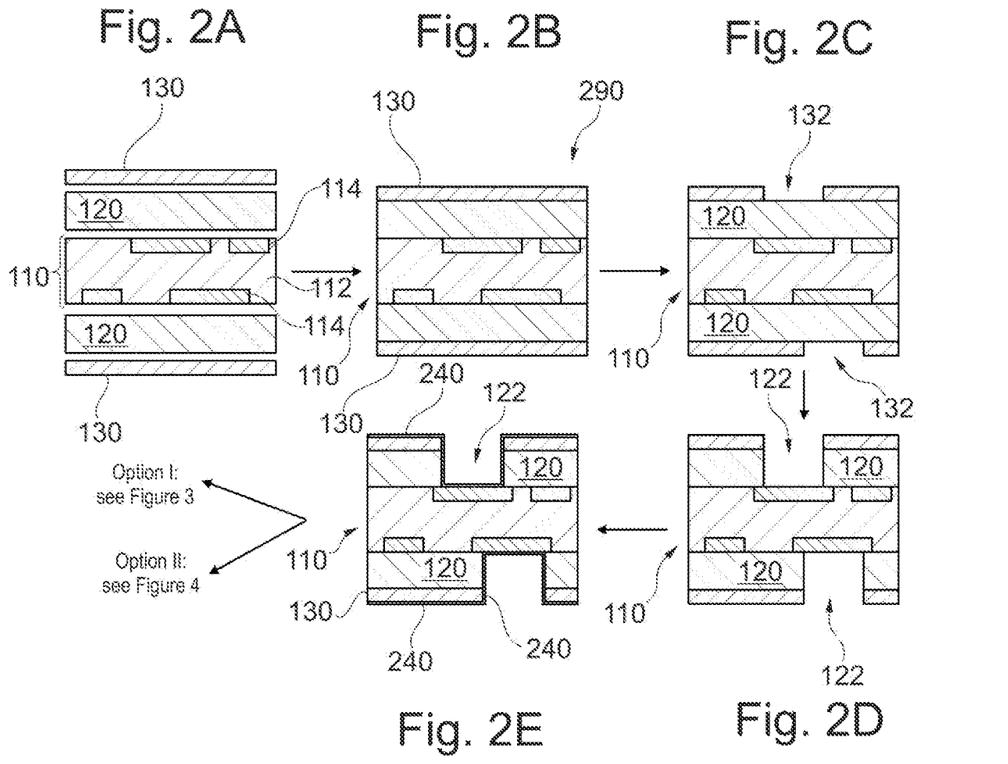
FIGS. 2A, 2B, 2C, 2D, 2E illustrate a process overview for forming recesses/vias within two PID layers provided at different sides of a PCB layer stack.

FIG. 2A shows various so far separate layers before a lamination. Specifically, the so far separate layers include, from the bottom up, a lower electrically conductive layer 130, a lower PID layer 120, a (middle) laminated PCB layer stack 110, an upper PID layer 120, and an upper electrically conductive layer 130. In the illustrated embodiment, the PCB layer stack 110 is embedded in a trace-like manner. However, it could also be realized with a conventional stack-up such as that shown in FIGS. 1A through 1C. Further, in the embodiment illustrated in FIG. 2A, the laminated PCB layer stack 110 comprises two metal layer structures 114 and a dielectric resin layer 112 formed between the two metal layer structures 114. It is pointed out that the PCB layer stack 110 could also comprise more than two layers, which could be denominated a multi-layer stack-up.

FIG. 2B shows the arrangement of FIG. 2A after lamination. In this document the corresponding laminated arrangement is denominated a laminated layer stack 290. FIG. 2C shows the laminated arrangement after the upper electrically conductive layer 130 and the lower electrically conductive layer 130 have been structured such that openings 132 are formed (by means of a first lithographic process). FIG. 2D shows the result of the second lithographic process, wherein in the region being aligned with the openings 132 of the PID layers 120 has been selectively removed such that corresponding recesses 122 are formed. In the embodiment described here, the recesses 122 expose or uncover portions of the two metal layer structures 114.

In a next step, the result of which is shown in FIG. 2E, a seed layer 240 is deposited both on the upper side and the lower side of the structure shown in FIG. 2D. According to the embodiment described here the seed layer 240 is formed by means of an electroless deposition of copper, or dry process deposition such as sputtering.

Figure 3A:
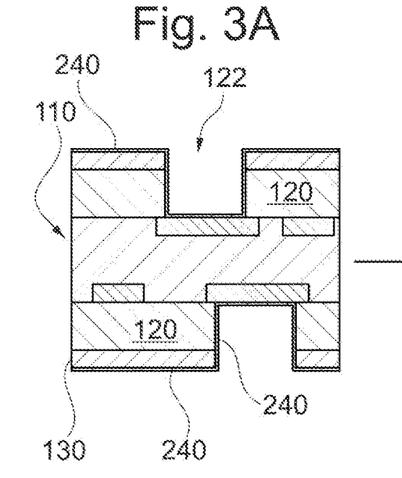
FIGS. 3A, 3B illustrate a full panel plating as an option I following the process shown in FIGS. 2A-2E.
Figure 3B:
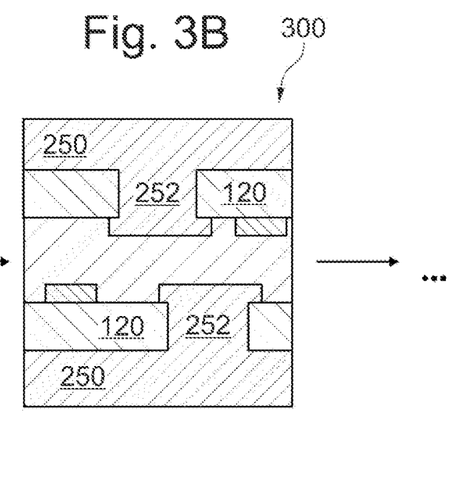

Descriptively speaking, FIGS. 3A, 3B and FIGS. 4A through 4D show two process options, respectively, for building up further built-up structures on both sides of a PCB, as obtained with the procedure illustrated in FIGS. 2A through 2E. Option I is illustrated in FIGS. 3A and 3B, Option II is illustrated in FIGS. 4A through 4D.

It is pointed out that the process described above can be applied also for core-less layer stacks being sandwiched between two PID layers. A corresponding core-less process flow consists in manufacturing two PCBs constituted only of build-up layers (i.e. without a mechanically stabilizing core) on the two sides of a temporary carrier. After manufacturing, the two PCBs are separated from the temporary carrier.

FIGS. 3A, 3B illustrate a full panel plating as Option I following the process shown in FIGS. 2A through 2E. FIG. 3A, which shows the starting point for the full panel plating option, is identical to FIG. 2E described above. According to the embodiment described here, the full panel plating is realized by depositing an electrically conductive material 250 both on the upper side and the lower side of the structure shown in FIG. 3A. Specifically, according to the embodiment described here, the deposition of the electrically conductive material 250 is realized with a galvanic copper deposition within the recesses 122 and on the panel surface. As can be seen from the result of such a full panel plating, which result it is shown in FIG. 3B, within the regions of the recesses 122 there are formed metallized via connections 252. In this document the structure resulting from this is a component carrier 300. The component carrier 300 can be further processed either by using conventional subtractive etching or by using a so called modified semi-additive process. In this regard it is mentioned that in a conventional semi-additive process (SAP) a seed layer is deposited over the entire "naked" surface of a dielectric layer structure. In a modified SAP, a copper foil is present at the surface of the dielectric layer structure.

Figure 4A:
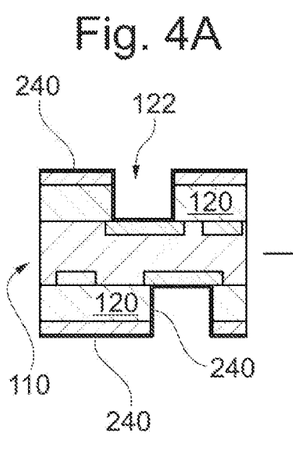
FIGS. 4A, 4B, 4C, 4D illustrate a via filling and pattern plating including a further lithographic step as an option II following the process shown in FIGS. 2A-2E.

FIGS. 4A through 4D illustrate a via filling and pattern plating process including a further lithographic step as Option II following the process shown in FIGS. 2A through 2E. Also for Option II the starting point, which is depicted in FIG. 4A, is the same as the structure shown in FIG. 2E.

Figure 4B:
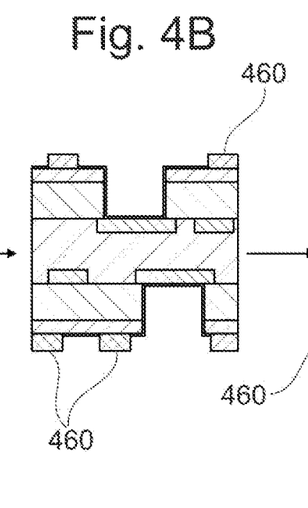
Figure 4C:
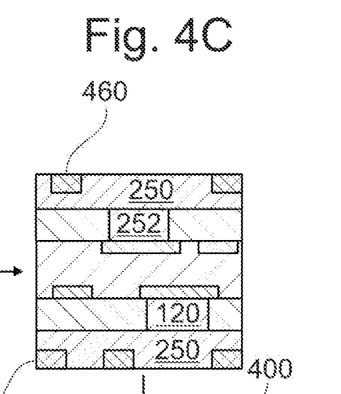
Figure 4D:
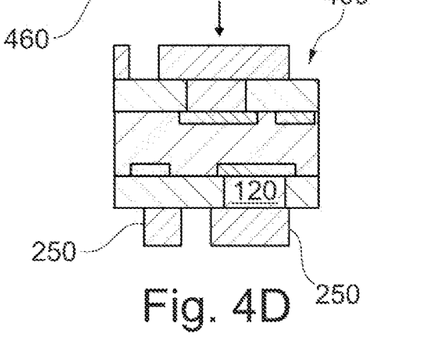

In the beginning of Option II, by means of a further lithographic process, a photoresist (film) 460 is applied and structured on both surfaces. This is shown in FIG. 4B. Afterwards, a via and pattern plating procedure is executed again on both sides. Thereby, as can be seen from FIG. 4C, an electrically conductive material 250 including fully metallized via connections 252 is deposited (on both sides). Finally, as can be seen from FIG. 4D, the photoresist 460 is stripped off, and the conductive layer below it is etched away. In this document the structure resulting from this "stripping off" and etching is a component carrier 400.

FIGS. 5A-5E illustrate a process for contacting an electronic component 516 being embedded within a laminated PCB layer stack 510. The process is almost completely the same as the process illustrated in FIGS. 2A through 2E, including the two further processing options I and II shown in FIGS. 3A, 3B and FIGS. 4A through 4D, respectively. As can be taken already from FIG. 5A the only difference between these two processes is that the laminated PCB layer stack 510 accommodates the embedded electronic component 516 whereas the PCB 110 (illustrated in FIGS. 2A-2E) does not have an embedded component. In accordance with the embodiment described here the electronic component 516 may be embedded or integrated completely within the body of the PCB 510. Alternatively, the electronic component 516 may be accommodated within the PCB 510 such that one surface of the electronic component 516 forms a part of the surface of the PCB 510. At this point it is mentioned again that the metal layer structure 114 can be either an embedded trace-like structure or a conventional PCB, where a conductive track is formed on or over a dielectric layer structure.

Figures 5A, 5B, 5E:
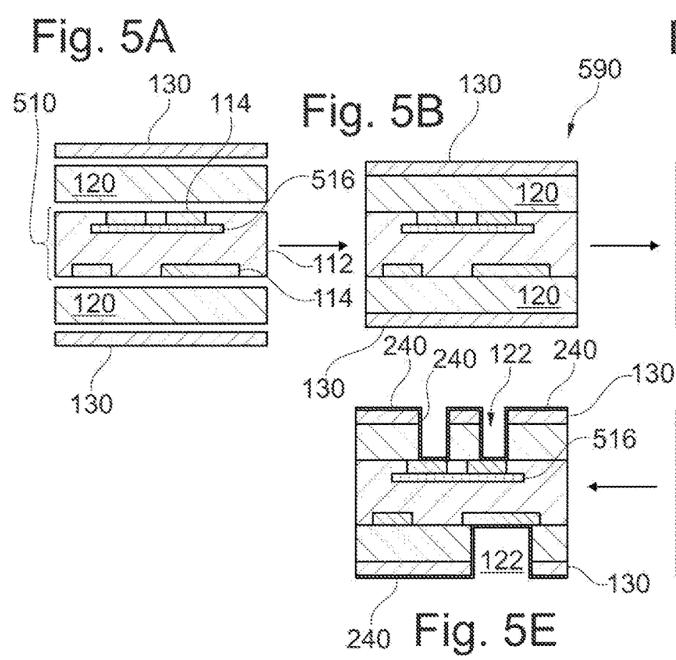
FIGS. 5A, 5B, 5C, 5D, 5E illustrate a process for contacting an electronic component being embedded within a PCB.

FIG. 5B shows a laminated layer stack 590 with a PID layer 120 and an electrically conductive layer 130 laminated both on an upper side and on a lower side of the laminated PCB layer stack 510. Again, also in the embodiment described here the electrically conductive layer 130 is a copper layer.

Figure 5C:
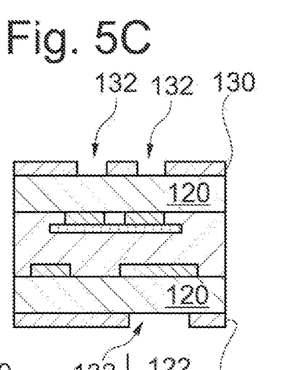

FIG. 5C shows the laminated layer stack after (i) a first lithographic process performed at or performed with both the upper copper layer 130 and the lower copper layer 130, after (ii) a corresponding copper etching, and after (iii) a usual photo resist (not depicted) stripping.

Figure 5D:
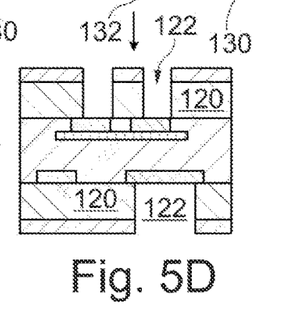

FIG. 5D shows the laminated layer stack after a second lithographic process performed with both PID layers 120. Thereby, recesses 122 within the PID layers 120 are formed.

FIG. 5E shows the laminated layer stack after a deposition of a seed layer, e.g. copper, 240. Further process options are shown in FIGS. 3A, 3B and 4A through 4D, respectively.

The above elucidated principles of structuring a PID layer with a lithographic process, wherein a mask representing a structured electrically conductive layer of the final product is employed, can also be applied to wafer/panel level packaging (WLP/PLP) manufacturing methods. In this context FIGS. 6A through 6D illustrate a process for obtaining a redistribution layer (RDL) arrangement on fan-out/wafer level packages.

Figures 6A, 6B, 6C, 6D:
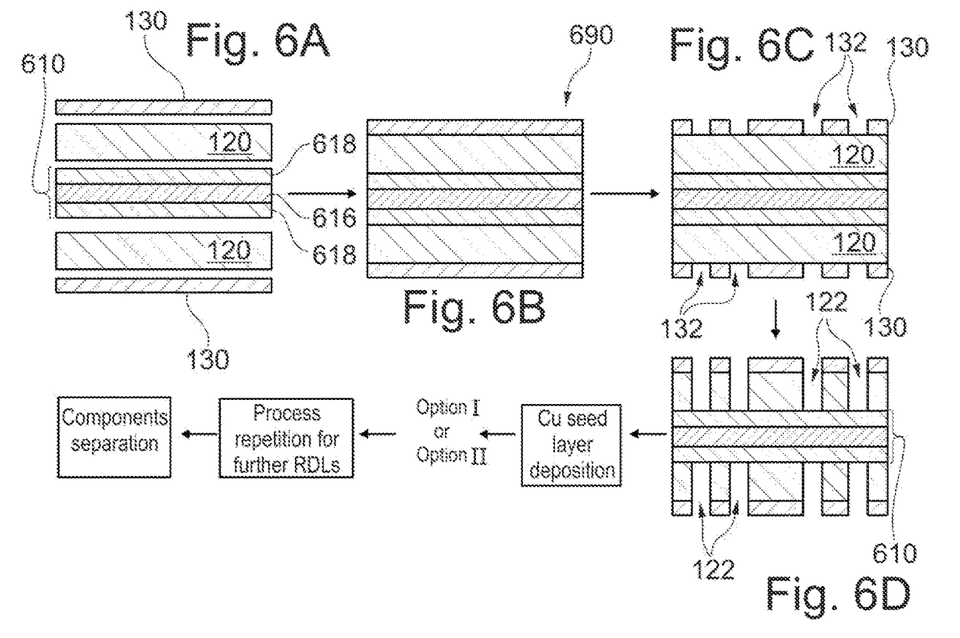
FIGS. 6A, 6B, 6C, 6D illustrate a process for obtaining a redistribution layer (RDL) arrangement on fan-out/wafer level packages or panel-level packages.

The starting point for a corresponding process, which starting point is illustrated in FIG. 6A, is given by a plurality of layers. These layers include, from the bottom up, a lower electrically conductive layer 130, a lower PID layer 120, a (middle) layer stack 610, an upper PID layer 120, and an upper electrically conductive layer 130. In the embodiment described here the layer stack 610 comprises two artificial wafer structures 618 and a carrier structure 616 formed between the two artificial wafer structures 618. The artificial wafer 618 comprises at least two unhoused/bare semiconductor components or naked chips.

FIG. 6B, shows the corresponding laminated layer stack 690 which is obtained by means of a lamination of the two PID layers 120 and the two electrically conductive layers 130 along either opposed surface of the layer stack 610.

FIG. 6C shows the laminated layer stack after (i) a first lithographic process performed at or performed with both the upper copper layer 130 and the lower copper layer 130, after (ii) a corresponding copper etching, and after (iii) a usual photo resist (not depicted) stripping.

FIG. 6D shows the laminated layer stack after a second lithographic process performed with both PID layers 120. Thereby, a plurality of recesses 122 within the PID layers 120 are formed.

Further processing steps, which for the sake of conciseness of FIG. 6 are only mentioned (and not depicted) are (i) a copper seed layer deposition, (ii) a further processing either with one of the above elucidated options I and II, (iii) further process repetitions for obtaining further RDL structures or RDL arrangements, and (iv) a component separation in order to obtain a plurality of singularized and (fan-out) packaged semiconductor components.

Figure 7A:
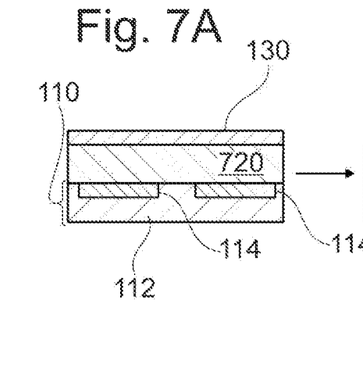
FIGS. 7A, 7B, 7C, 7D illustrate a recess/via formation within a negative type PID layer.

So far, the processes described are referring to a positive-type PID, i.e. the PID is structured where the exposure occurs. However, corresponding processes can also be realized for a negative-type PID. This means that PID material will be removed on the non-exposed parts. A corresponding process overview for a negative-type PID is shown in FIGS. 7A through 7D. Thereby, apart from employing a negative type PID layer 720 the starting point shown in FIG. 7A is very similar to the laminate structure shown in FIG. 1A.

Figure 7B:
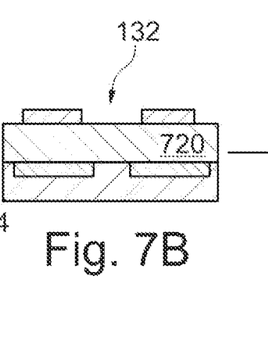

FIG. 7B shows the laminated layer stack after (i) a first lithographic process performed at or performed with the electrically conductive layer 130, after (ii) a corresponding selective etching away of portions of the electrically conductive layer 130 such that openings 132 are produced, and after (iii) a usual photo resist (not depicted) stripping.

Figures 7C, 7D:
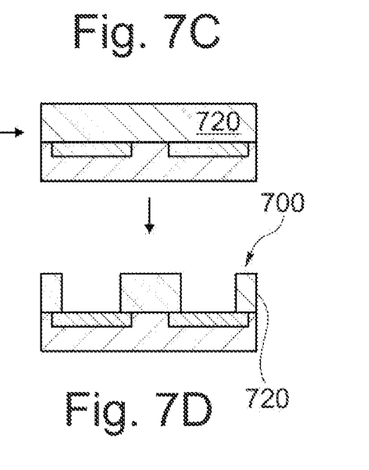

FIG. 7C shows the laminated layer stack after (i) a second lithographic process performed at or performed with the PID layer 720 and after (ii) a (complete) removal of the remaining material of the electrically conductive layer structure 130. A second curing step might be necessary, either thermal or with electromagnetic radiation, before stripping off the PID material.

FIG. 7D shows the laminated layer stack after a removal of the not photo-imaged regions of the negative-type PID layer 720. In this document the corresponding PID structured laminate is denominated a component carrier 700.

Descriptively speaking, the process described with reference to FIG. 7 leaves the "bare" PID material (i.e. no copper foil on it) unaffected. However, the roughness of the electrically-conductive layer structure 130, which has been used as a mask for photo-imaging, will leave its profile imprinted within the PID layer 720. Such a roughness might be then used as mechanical adhesion, in addition to the chemical one achieved with an electroless deposition of copper (not depicted). Afterwards, conventional structuring processes can be used to proceed with the component carrier manufacturing.

Figures 8A, 8B, 8E:
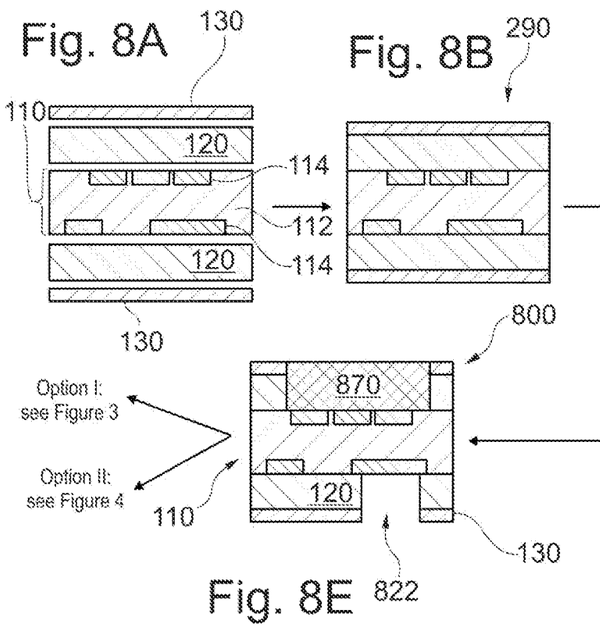
FIGS. 8A, 8B, 8C, 8D, 8E illustrate a cavity formation within a PID layer by using a patterned electrically conductive layer structure as a mask.
Figure 8C:
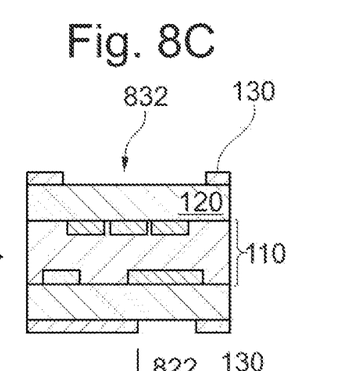
Figure 8D:
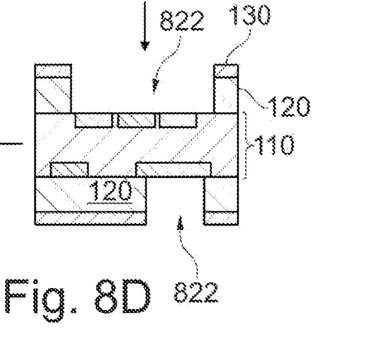

The structuring methods elucidated above can also be used to obtain any kind of z-direction structures, like vias, cavities, trenches, etc. FIG. 8 illustrates a cavity formation within a PID layer by using a patterned electrically conductive layer structure as a mask.

The corresponding process steps or intermediate products, which are depicted in FIG. 8A, FIG. 8B, and FIG. 8C, fully correspond to the process steps or intermediate products shown in above elucidated FIG. 2A, FIG. 2B, and FIG. 2C, respectively. The only difference between FIG. 8C and FIG. 2C is that an opening 832 within the electrically conductive layer structure 130 is much larger that the opening 132. Correspondingly, also the recess 822 representing a cavity 822 shown in FIG. 8D is much larger than the recess 122 shown in FIG. 2D.

The arrangement shown in FIG. 8D is further processed by forming a cavity protection 870 within the upper cavity 822 in the PID layer 120. According to the embodiment described here the lower cavity 822 remains unprotected. The cavity protection can be realized for instance by a screen printing procedure, adding a coverage mask during a lithographic process or any other appropriate procedure known to the skilled person. FIG. 8E shows the corresponding structure which in this document, although representing an intermediate product, is denominated a component carrier 800.

As can be taken from FIGS. 8A through 8E, a further processing can be carried out again with the two process options I and II as shown in and as described in conjunction with FIGS. 3A, 3B and FIGS. 4A through 4D, respectively.

The invention or the embodiments of the invention described in this document can be descriptively and briefly summarized as follows. With this document a structuring method of PID is presented, which is based on exploiting a structured copper foil as a mask for the PID layer itself. Subsequently, electroless copper will be deposited in particular on the sidewalls of recesses (e.g. vias) formed within the PID material. Further subsequently, a copper plating can be executed. A similar strategy can be adopted in order to form recess portions within a PCB.

It should be noted that the term "comprising" does not exclude other elements or steps and the use of articles "a" or "an" does not exclude a plurality. Also elements described in association with different embodiments may be combined.

LIST OF REFERENCE SIGNS 100 component carrier
110 layer stack/laminated PCB layer stack/PCB core
112 dielectric resin layer
114 metal layer structure
120 photoimageable dielectric layer (structure)
122 recess
130 electrically conductive layer structure/mask
132 opening
190 laminated layer stack
240 seed layer
250 electrically conductive material
252 via connection
290 laminated layer stack
300 component carrier
400 component carrier
460 photoresist
510 layer stack/laminated PCB layer stack
516 embedded component
590 laminated layer stack
610 layer stack
616 carrier structure
618 naked chip/bare semiconductor component/artificial wafer
690 laminated layer stack
700 component carrier
720 negative-type photoimageable dielectric layer (structure)
800 component carrier
822 cavity
832 opening for cavity
870 cavity protection

The invention claimed is:

1. A method for manufacturing a component carrier, the method comprising:
providing a layer stack comprising at least one component carrier material;
forming a photoimageable dielectric layer structure on the layer stack;
forming a spatial pattern of an electrically conductive layer structure on the photoimageable dielectric layer structure, wherein the spatial pattern comprises openings formed within the electrically conductive layer structure;
exposing the photoimageable dielectric layer structure to electromagnetic radiation, wherein the spatial pattern of the electrically conductive layer structure represents a mask for selectively exposing predefined regions of the photoimageable dielectric layer structure;
selectively removing material from the photoimageable dielectric layer depending on the spatial pattern,
wherein at least one recess is formed by selectively removing material from the photoimageable dielectric layer depending on the spatial pattern of the electrically conductive layer structure; and
forming an electrically conductive material within the at least one recess.

2. The method as set forth in claim 1, wherein the layer stack, the photoimageable dielectric layer structure, and the electrically conductive layer structure are assembled together by a lamination procedure.

3. The method as set forth in claim 2, wherein the layer stack comprises at least one dielectric layer and at least one structured metal layer, wherein the structured metal layer of the layer stack is structured with respect to the spatial pattern of the electrically conductive layer structure such that the structured metal layer forms a bottom part of the recess.

4. The method as set forth in claim 3, wherein the structured metal layer forms a part of a surface of the layer stack, on which surface the photoimageable dielectric layer structure is formed.

5. The method as set forth in claim 1, wherein the selectively removing of material is done by etching.

6. The method as set forth in claim 1, further comprising:
depositing a seed layer on at least one of the photoimageable dielectric layer structure and the electrically conductive layer structure.

7. The method as set forth in claim 1, further comprising:
forming the electrically conductive material on the electrically conductive layer structure.

8. The method as set forth in claim 7, further comprising:
forming the electrically conductive material for forming a pattern within a plane being perpendicular to the vertical extension of the recess.

9. The method as set forth in claim 7, wherein the electrically conductive material is provided by galvanic copper deposition in at least one of the recess and on the electrically conductive layer structure.

10. The method as set forth in claim 7, wherein the electrically conductive material within the recess forms metallized via connections.

11. The method as set forth in claim 7, wherein before providing the electrically conductive material the method further comprises
applying a photoresist film on a surface of the electrically conductive layer structure.

12. The method as set forth in claim 11, further comprising:
stripping off the photoresist film after providing the electrically conductive material.

13. The method as set forth in claim 7, further comprising:
removing the electrically conductive material by etching.

14. The method as set forth in claim 1, further comprising:
forming a further photoimageable dielectric layer structure at the bottom of the layer stack, wherein the further photoimageable dielectric layer structure has at least one further recess extending vertically through the further photoimageable dielectric layer structure,
forming the at least one further recess by partially removing the further photoimageable dielectric layer structure in further regions which are defined by a further spatial pattern of a further electrically conductive layer structure being formed at the bottom of the further photoimageable dielectric layer structure, wherein the further spatial pattern comprises further openings formed within the further electrically conductive layer structure.

15. The method as set forth in claim 1, further comprising: accommodating at least one component within the at least one recess.

* * * * *